United States Patent [19]
Kluth et al.

[11] Patent Number: 5,469,335
[45] Date of Patent: Nov. 21, 1995

[54] POWER DISTRIBUTION CONNECTOR APPARATUS FOR BACK-TO-BACK SANDWICHED CIRCUIT BOARDS

[75] Inventors: Michael R. Kluth, Tomball; Roberta M. Reents, Austin, both of Tex.

[73] Assignee: Compaq Computer Corporation, Houston, Tex.

[21] Appl. No.: 339,488

[22] Filed: Nov. 14, 1994

[51] Int. Cl.[6] .................................................. H05K 7/14
[52] U.S. Cl. .......................... 361/800; 361/752; 361/796; 361/816; 174/35 R; 439/108
[58] Field of Search ...................................... 361/752, 753, 361/796, 797, 799, 800, 816, 818; 174/35 R, 35 TS; 439/108, 109; 333/246, 247; 220/402; 455/300

[56] References Cited

U.S. PATENT DOCUMENTS

| | | | |
|---|---|---|---|
| 4,747,019 | 5/1988 | Ito et al. | 361/424 |
| 5,130,896 | 7/1992 | Babb et al. | 361/424 |

FOREIGN PATENT DOCUMENTS

| | | | |
|---|---|---|---|
| 3604730 | 8/1986 | Denmark . | |

OTHER PUBLICATIONS

Elcon, Top Drawer Catalog, Note figs. and related text on pp. 4, 8, & 12. Oct./1993.
Elcon, Lower Drawer Catalog, Note fig. and related text on p. 4. Feb./1994.
Elcon, Crown Clip Product Data Sheet, May/1993.
Elcon, Guide to the Uses and Applications of Helix and Crown Interconnect Technology, Note figs. & text pp. 4, 6, 8–15.
Elcon, ICCON Catalog, Note figs. and related text on pp. 4 & 14.
Elcon, Domino Catalog, Note figs. and related text on pp. 4 & 20.

*Primary Examiner*—Leo P. Picard
*Assistant Examiner*—Y. Whang
*Attorney, Agent, or Firm*—Konneker & Bush

[57] ABSTRACT

A power distribution system and a method for supplying power to a first circuit board having a first contact member conductively mounted thereto and a first aperture through the first contact member substantially coaxially aligned with a first opening through the first circuit board is provided by the present invention. The system comprises an elongated conductive rod that is removably positioned through the first aperture and the first opening and that extends normally from the first circuit board. The rod is electrically connectable to the first circuit board by a first contact member and has a length sufficient to (a) enter a second aperture of a second contact member conductively mounted on a second circuit board parallel to and adjacent one side of the first circuit board and (b) contact a power connector adjacent an opposite side of the first circuit board to thereby allow the rod to distribute electrical current to multiple circuit boards.

35 Claims, 1 Drawing Sheet

POWER DISTRIBUTION CONNECTOR APPARATUS FOR BACK-TO-BACK SANDWICHED CIRCUIT BOARDS

BACKGROUND OF THE INVENTION

1. Field of the Invention

The present invention generally relates to power distribution connector apparatus for circuit boards, and more particularly relates to a current distribution rod connector apparatus for back-to-back sandwiched circuit boards.

2. Description of Related Art

The use of circuit boards in computer systems is well known. Typically, these circuit boards are printed circuit boards; that include an interconnected array of integrated circuits such as microprocessor chips, software programming chips and imprinted electrical circuits, all designed to provide the user with an efficient personal computer ("PC").

Initially, PCs were stand-alone devices, each containing separate hardware, operating system, application software and user data. However, as use of PCs spread within business organizations, the need for shared data and hardware resources grew, and local area network ("LANs") came into being. ALAN (or its more- geographically-dispersed .counterpart, the wide area network ("WAN")) comprises a number of PCs ("clients") linked to one another (typically by a high speed serial communications link) and centers around a relatively high performance PC (a "server") that delivers application programs and data to the clients and manages system-wide resources, such as secondary storage units and printers.

Because the server is designed to serve several PCs in a given LAN, the storage capacity, as well as the processing capability of these LAN servers is very large. Consequently, their processing and storage capacity has grown over the years with the increasing demand placed on them by larger networks designed to manipulate more data. Many of these network systems employ large computer systems housed in rack-type cabinets that are designed to house a plurality of interconnected circuit boards and other electronic components.

In the past, these circuit boards have been powered by conventional power strips or busbars. While such devices are adequate for applications in personal computers, they are presently less desirable in larger rack-type cabinet computers that house a plurality of circuit boards. The reason for this is that conventional power strips and busbars are not able to supply sufficient current to a plurality of circuit boards that are comprised of today's faster, current-hungry microprocessor chips. As the need for management of large amounts of data has increased, microprocessor chips have been redesigned to operate at extraordinary fast megahertz speeds. Unfortunately, however, increasing the speed of the microprocessor chips has also increased the amount of current needed to operate the chips. As a result, there is presently a need for a high density current system capable of delivering the amount of current necessary to operate today's faster microprocessor chips.

In a conventional power strip or busbar, the current has to be "summed" and then redistributed. That is, most busbars or power strips are supplied by a ribbon cable having either a multi-pin male or multi-pin receiving female connectors. Each pin or pin receiving opening in the connector receives a portion of the total current from the small wire supplying the current to that particular pin or pin receiving opening. The total current received by the connector is then re-distributed to the various components attached to the board. The small wire supplying the connector and the corresponding small wire imprinted in the busbar, which leads from the connector to the various distribution points, are designed to carry only so much current. Thus, with today's faster current-hungry microprocessor chips, it is more difficult to supply the amount of current that is needed to operate these chips using conventional busbars or power strips. One solution, of course, would be to increase the number of busbars in the system. However, increasing the number of power strips or busbars is not an acceptable solution because they require more space in an already cramped hardware environment and add to the overall cost of the system.

Furthermore, although conventional busbars or power strips could be modified to transmit more current, there are disadvantages associated with making such modifications. First, any such modification may require the use of expensive highly conductive alloys such as gold or platinum, which significantly increase the overall cost of the unit. Second, even with these modifications, the base structures of the busbars and power strips would still require a significant amount of housing space.

In an attempt to solve this current problem, the prior art provides high density current power pins that are employed to supply current to various electronic apparatus. However, the use of these devices have been typically limited to three applications. First, the pins are combined with connectors to supply current to a single unit, whether that be a circuit board with microprocessors or to some other type of electrical component. Second, they are either used to supply current to individual units from a busbar from which several electrical connectors and pins extend or used to supply current to two daughter boards from a separately powered mother board. Third, they are used to transfer digitized signals from one circuit board to another.

While these designs and applications address some of the problems previously mentioned, they are lacking in many respects. For example, the first application mentioned above is not well suited in a rack cabinet application where a plurality of circuit boards are arranged in a parallel series. In such applications, each board would have its own pin and power source connected to it. Therefore, several power pins and connectors would have to be utilized to supply current to the plurality of boards typically found in a rack cabinet. Furthermore, the numerous connectors and pins would require more space and can thus limit the way in which the circuit boards may be arranged within the rack cabinet. Additionally, the plurality of connectors and pins in such an application would add to the overall cost of the server unit. Likewise, the second application is not well suited for use in a rack cabinet because a busbar or power strip, which may have several electrical leads extending to several pins and connectors, would be employed. As previously discussed, the busbar or power strip is inadequate in with respect to its current distribution capabilities. In either the first or second applications, however, the cost of the server unit increases due to the additional electrical hardware that is needed, and the problems associated with housing this additional hardware are still present.

The third application is, of course, not directed to the transmission of current sufficient to run a current-hungry microprocessor, but is instead directed to the transmission of smaller amounts of current for sending and receiving digital signals between circuit boards.

Therefore, it can readily be seen that there is a need in the art for a current distribution system that is inexpensive, compact and one that is capable of supplying adequate current to a plurality of parallel circuit boards. Accordingly, it is an object of the present invention to provide a current distribution rod and system that is capable of supplying an adequate amount of current to a plurality of circuit boards arranged in a parallel series.

SUMMARY OF THE INVENTION

In carrying out principles of the present invention, in accordance with a preferred embodiment thereof, there is provided a power distribution system and a method for supplying power to a first circuit board. The first circuit board has a first contact member with a first aperture conductively mounted on the board that is substantially coaxially aligned with a first opening through the first circuit board. The system comprises an elongated conductive rod that is removably positioned through the first aperture and the first opening and that extends in a normal, i.e., perpendicular, direction from the first circuit board. The rod is electrically connectable to the first circuit board by the first contact member and has a length sufficient to (1) enter a second aperture of a second contact member conductively mounted on a second circuit board parallel to and adjacent one side of the first circuit board and (2) contact a power connector adjacent an opposite side of the first circuit board to thereby allow the rod to distribute electrical current to multiple circuit boards.

In another embodiment of the present invention, the rod distributes power to a second circuit board that has a second contact member conductively mounted thereto. A second aperture is formed through the second contact member and is substantially coaxially aligned with a second opening through the second circuit board. The rod is removably positioned through the second aperture and the second opening in a direction normal to the second circuit board to thereby electrically couple the second circuit board to the rod.

In another aspect of the preferred embodiment, the system also includes a power connector that is comprised of an electrical contact located within a socket body and a flexible conductor coupled to the electrical contact. The electrical contact is adapted to receive an end of the rod to allow electrical transmission between the flexible conductor and the rod. The power connector may be either mechanically coupled directly to one end of the rod or it may be mechanically coupled to the insulating cap located about the first contact by either frictional force or a positive engagement. The frictional force may be the result of the first contact member urging itself against the contact member, and the positive engagement may be provided by cooperating detents on the power connector and the insulating cap or cooperating detents on the first contact member and the end of the rod.

In another aspect of the present invention, the first contact member preferably comprises a resilient conductive member adapted to urge against the rod to make electrical contact therewith and preferably includes a mounting pin for mechanically and electrically mounting the first contact member to the first circuit board. The first contact member may be housed in an insulating cap electrically to insulate the first contact member from the surrounding environment.

The second contact member may also preferably comprise a resilient conductive member adapted to urge against the rod to make electrical contact therewith and also preferably includes a mounting pin for mechanically and electrically mounting the second contact member to the second circuit board. The second contact member may be housed in an insulating cap electrically to insulate the second contact member from the surrounding environment.

In yet another aspect of the present invention, the system further comprises a chassis for housing the first and second circuit boards. Preferably, the chassis has a chassis member with a chassis member aperture therethrough and that is interposed between the first and second circuit boards. The first, second and chassis member apertures are positioned to be substantially co-linear with respect to one another to allow the rod to pass through the first, second and chassis member apertures. In another aspect of this embodiment, an electromagnetic shield may be interposed between the first and second circuit boards. The chassis member may be formed of conductive material, having a chassis member aperture and interposed between the first and second circuit boards to form an electromagnetic shield wherein the first, second and chassis member apertures are substantially co-linear with respect to one another to allow the rod to pass through the first, second and chassis member apertures. Additionally, an insulator electrically disposed in the chassis member aperture to isolate the rod from the chassis member may also be included in the system.

In yet another aspect of the present invention, a method of distributing power to a first circuit board having a first contact member with an aperture therethrough that is conductively mounted to the first circuit boarder and substantially coaxially aligned with a first opening through said first circuit board is provided. The method comprises the steps of removably positioning an elongated conductive rod through the first aperture and the first opening and extending normally from the first circuit board. The rod is electrically connectable to the first circuit board by the first contact member and has a length sufficient to (1) enter a second aperture of a second contact member conductively mounted on a second circuit board parallel to and adjacent one side of the first circuit board and (2) contact a power connector adjacent an opposite side of the first circuit board. The method further comprises the step of distributing electrical current to the first circuit board via the rod. Additionally, electrical current may also be distributed to a plurality of circuit boards that can also be electrically connected to the rod in the same manner as the first circuit board.

The foregoing has outlined rather broadly the features and technical advantages of the present invention so that the detailed description of the invention that follows may be better understood. Additional features and advantages of the invention will be described hereinafter which form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit: and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
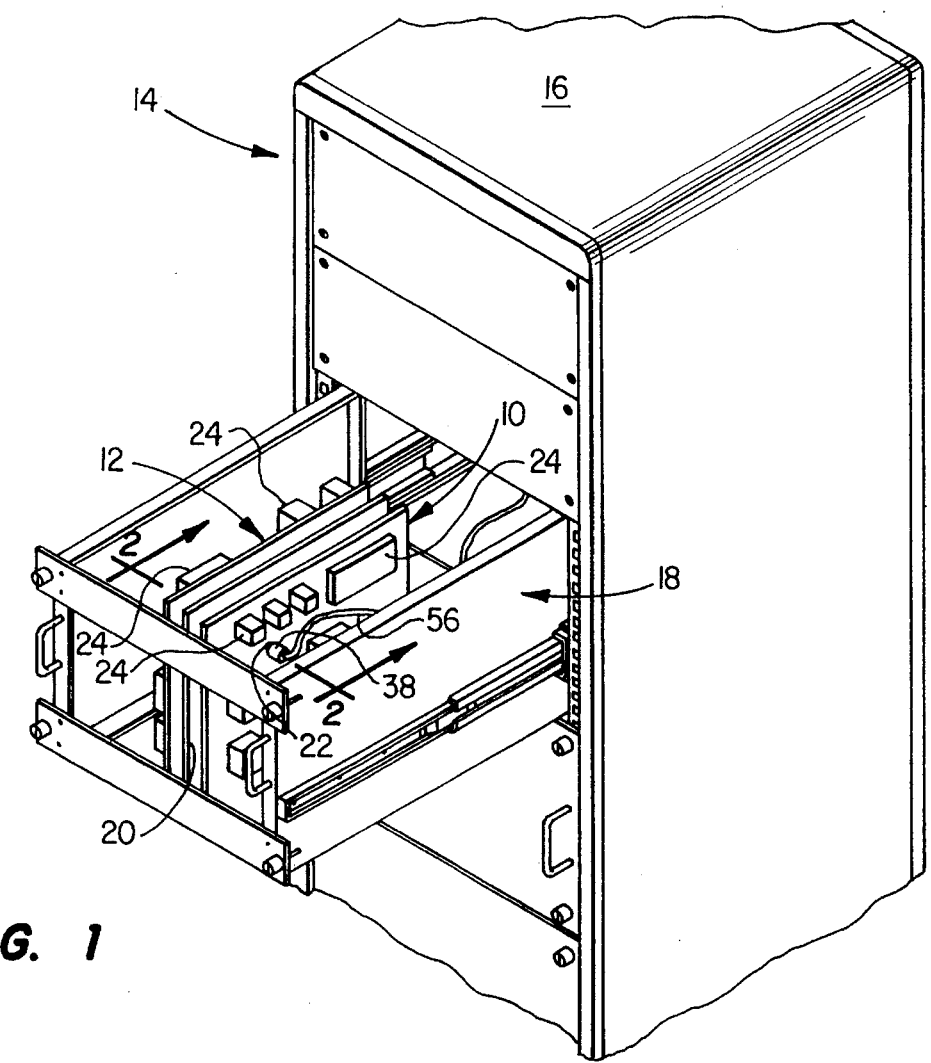
FIG. 1 illustrates a perspective view of a drawer of a rack cabinet with circuit boards mounted therein that are connected by the power distribution system of the present invention.

Referring initially to FIG. 1, in a preferred embodiment thereof, the present invention provides an elongated horizontally positioned current distribution rod that is connected to a plurality of vertically oriented circuit boards 10,12, which are housed in a housing structure 14. The housing structure 14 may be a multi-drawer rack cabinet 16 of the type used for housing a large computer system such as those used in network systems, or alternatively, the housing structure may be a cabinet structure typically associated with smaller personal computers ("PCs"). The rack cabinet 16 typically includes a plurality of slidably mounted drawers 18 for housing a plurality of circuit boards and other electrical components that typically comprise a computer system such as floppy disk drives, hard disk drives, CD ROM drives, buses, cooling fans and the like. The rack cabinet 16 may also have a vertically positioned chassis member 20 interposed between the plurality of circuit boards 10,12. The chassis member 20, which may be a drawer divider wall, can serve several purposes. For instance, the chassis member 20 may be an integral part of the support structure of the rack cabinet drawer 18, or it may function to also lend structural support to the rod 22. Additionally, the chassis member 20 may act as an electromagnetic shield to physically shield each of the circuit boards 10,12 from the electromagnetic field generated by the neighboring circuit board.

The circuit boards 10,12, which are positioned in the drawer 18 of the rack cabinet 16, are connected to the single electrical current distribution rod 22 that extends through both circuit boards 10,12 and the chassis member 20 as illustrated. The rod 22 is adapted to supply electrical current to both of the circuit boards 10,12, without the need of expensive and space consuming power buses, strips or busbars. The circuit boards 10,12 are preferably printed circuit boards having integrated circuits and printed circuits thereon of the type used in computer systems.

Figure 2:
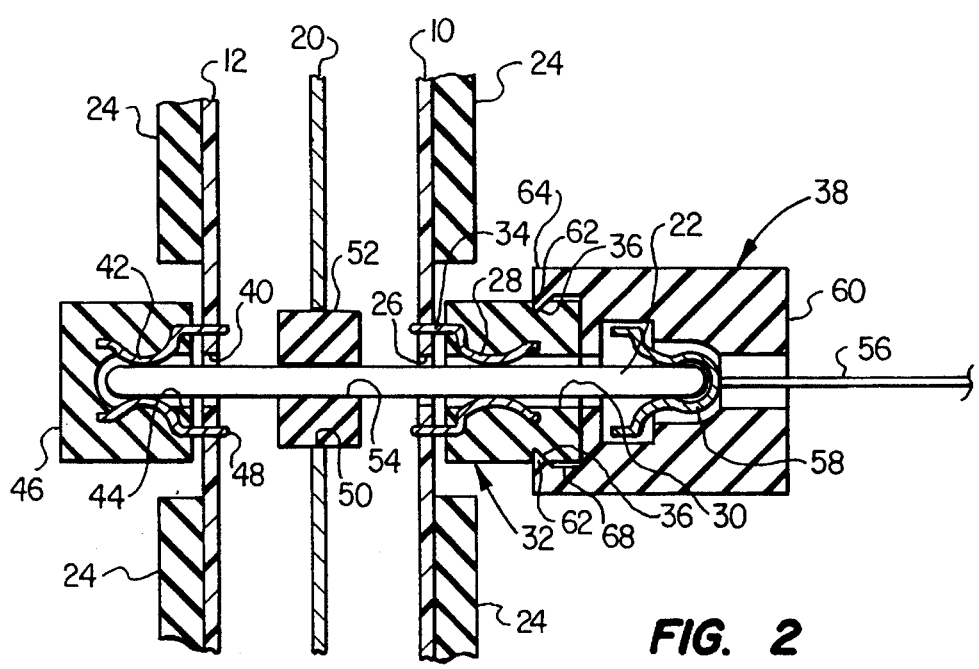
FIG. 2 illustrates a cross-section side view taken along line 2—2 of circuit boards connected to the power distribution system of the present invention.

Turning now to FIG. 2, there is illustrated a cross-sectional view of the power distribution system of the present invention. A first vertically mounted circuit board 10 with a second vertically oriented circuit board 12 mounted back-to-back and parallel to the first circuit board 10 are positioned in the rack cabinet as previously discussed. The chassis member 20 is interposed between the first and second circuit boards 10,12. The first and second circuit boards 10,12 and the chassis member 20 have substantially co-linear aligned openings formed through them to receive the rod 22 through the first and second circuit boards 10,12 and the chassis member 20.

The first circuit board 10 is preferably a conventionally formed printed circuit board with an array of integrated circuits 24, such as central processing units, RAM memory and ROM memory interconnected by and to the printed circuit positioned on the front side of the first circuit board 10. As previously mentioned, the first circuit board 10 has an opening 26 for removably receiving the rod 22 therethrough. While only one opening is illustrated, it will be appreciated that a plurality of openings could be formed through the first circuit board 10 for receiving a plurality of distribution rods therethrough.

A contact member 28, representatively illustrated here as a thru cap member, is conductively mounted to the first circuit board 10. Preferably, the contact member 28 is mounted on the front side of the first circuit board 10 and has an aperture 30 formed through it that is substantially coaxially aligned with the opening 26 through the first circuit board 10 for receiving the rod 22 therethrough. The contact member 28 may be a resilient conductive member adapted to urge against the rod 22 to make electrical contact with the rod 22 when the rod 22 is removably positioned through the contact member 28. It should be understood that the opening 26 may be a conventional via formed through the first circuit board 10 and the contact member 28 may be the conductive metal lining the inside of the via, or alternatively, the contact member 28 may be a spring-like biasing member positioned in the via.

When the rod 22 is positioned through the contact member 28, electrical current may be transmitted from the rod 22 to the first circuit board 10 through the contact member 28. Again, it will be appreciated that a plurality of contact members could be mounted on the board to receive a plurality of rods therethrough. The contact member 28 is preferably housed in an insulative body 32 and is electrically connected to and mounted on the first circuit board 10 by conductive mounting pins 34 extending outwardly from the insulative body 32. The outside wall portions of the insulative body may have detents 36 formed therein for providing a means of connecting a power connector 38 to the rod 22.

While the preferred embodiment illustrates that the contact member 28 electrically connects the rod 22 to the first circuit board 10 through the mounting pins 34, it should be understood that the contact member 28 need not be connected to the first circuit board 10. In some applications, it may be desirable to allow the rod 22 to pass through the first circuit board 10 without supplying electrical current to the first circuit board 10. In such applications, the contact member 28 is not electrically connected to the mounting pins 34 and thus, will not be electrically connected to the first circuit board 10.

Positioned on the opposite side of the chassis member 20 and in a parallel, back-to-back relationship with the first circuit board is the second circuit board 12. The second circuit board 12 is also preferably a conventionally formed printed circuit board with an array of integrated circuits 24, such as central processing units, RAM memory and ROM memory interconnected by and to the print circuit positioned on the front side of the second circuit board 12. As previously mentioned, the second circuit board 12 has an opening 40 for receiving the rod 22 therethrough. While only one opening is illustrated, it will be appreciated that a plurality of openings could be formed through the second circuit board 12 as well for receiving a plurality of current distribution rods therethrough.

A contact member 42, representatively illustrated here as an end cap member, is conductively mounted to the front side of the second circuit board 12. The contact member 42 has an aperture 44 through it that is substantially coaxially aligned with the opening 40 in the second circuit board 12 for receiving the rod 22 therethrough. Of course, it will be understood that in those instances where the contact member 42 is an end cap, neither the aperture 44 nor the rod 22 extend all the way through the contact member 42. Moreover, it should be understood that as was the case with the first circuit board 10, the opening 40 in the second circuit board 12 may be a conventionally formed via and the contact member 42 may be the conductive interior portion of the via.

The contact member 42 may be a resilient conductive member adapted to urge against the rod 22 to make electrical contact with the rod 22, when the rod 22 is positioned through the contact member 42. When so positioned, electrical current may be transmitted from the rod 22 and to the first circuit board 10 through the contact member 42. The contact member 42 is preferably housed in an insulative body 46 and is electrically connected to and mounted on the first circuit board 10 by conductive mounting pins 48 that extend outwardly from the insulative body 46.

As was the case with the first circuit board 10, in some applications, the contact member 42 may not be electrically connected to the second circuit. In such applications, the contact member 42 is not electrically connected to the mounting pins 48. Instead, the rod 22 simply passes into or through the contact member 42 without supply current to the second circuit board 12.

Interposed between the backs of the first and second circuit boards 10,12 is the chassis member 20. As previously discussed, the chassis member 20 may be a divider wall in the drawer of the rack cabinet and may additionally serve as a support structure for further supporting the rod 22. The chassis member has an aperture 50 formed through it that is substantially co-linear with respect to the openings 26,40 in the first and second circuit boards 10,12 and that is adapted to receive the rod 22 therethrough.

In some applications, the chassis member 20 may be formed of a conductive material, such as sheet metal, and in such instances the aperture 50 may also include an insulator 52, with an opening 54, positioned in the aperture 50 of the chassis member 20 to electrically isolate the rod 22 from the chassis member 20.

The current distribution rod 22 of the present invention is an elongated rod member preferably comprised of a highly conductive material that will readily transmit current. The rod 22 preferably has a length sufficient to extend through the contact member 28 and the first circuit board 10 and enter the aperture 44 of contact member 42 that is mounted to the second circuit board 12. The length and diameter of the rod 22 may vary within design limitations, depending on the number of boards utilized in the system. If several boards are intended to be supplied with current, the rod 22 will necessarily be longer and have a length sufficient to extend through all of the circuit boards and chassis members, which may be interposed between the circuits boards. The diameter may also be larger to accommodate the larger current required by a larger number of circuit boards.

A power connector 38 is electrically connected to one end portion of the rod 22 and current is supplied to the rod 22 through the power connector 38 by a flexible conductor 56 as hereinafter described. The power connector 38 comprises an electrical contact member 58 located within a socket body 60 that may be electrically coupled to the flexible conductor 56 either by solder or mechanical means, such as a crimp connector. The electrical contact 58 is adapted to receive an end portion of the rod 22 to allow electrical transmission between the flexible conductor 56 and the rod 22.

The power connector 38 may be mechanically coupled to the rod 22 by, for example, either frictional force or positive engagement. Frictional force is achieved by the electrical contact 58 conductively urging or biasing itself against the end portion of the rod 22. In this application, the electrical contact 58 not only provides the electrical contact between the power connector 38 and the rod 22 but it also provides the means by which the power connector 38 is held onto the rod 22. More preferably, however, the socket body 60 of the power connector 38 is comprised of an insulative body, which isolates the electrical contact 58, that has detents 62 formed on the ends of opposing side wall portions 64 of the power connector 38, which are adapted to cooperatively and securely engage the detents 36 formed within the side walls 68 of the contact member 28.

In operation, in a preferred embodiment thereof, a plurality of circuit boards with integrated circuits interconnected with printed circuits on their front sides and openings therethrough are vertically positioned in row within a rack cabinet. Contact members with apertures and mounting pins extending therefrom are substantially co-axially aligned with the openings and mounted to each of the boards. What is meant by "substantially co-axially" or "co-linear" is that the various openings and apertures are aligned to allow the rod to extend from one opening or aperture in one circuit board to or through the opening or aperture in successive adjacent circuit boards. The mounting pins electrically connect each of the contact members with the integrated and printed circuits on each of the circuit boards. An elongated rod is removably positioned through the co-linear apertures of each contact member and the openings in each circuit board so that the rod's first end extends normally, i.e. in a perpendicular direction, outwardly from the front side of the first circuit board, and the rod's second end enters the aperture of the contact member on the last successive circuit board. Each contact member, which is electrically connected to each circuit board via the mounting pins, is urged against the rod to make electrical therewith.

The power connector, which is connected to an external power source is removably secured to the end portion of the rod that extends outwardly from the first circuit board. The power source is then engaged and current is supplied to the plurality of circuit boards via the rod and the contact members. If so required or desired, a system utilizing a plurality of rods supplying current to a plurality of circuit boards in the same manner as just described may be employed.

From the foregoing, it is apparent that the present invention provides a power distribution system and a method for supplying power to a first circuit board having a first contact member conductively mounted thereto and a first aperture through the first contact member substantially coaxially aligned with a first opening through the first circuit board. The system comprises an elongated conductive rod that is removably positioned through the first aperture and the first opening and that extends normally from the first circuit board. The rod is electrically connectable to the first circuit board by a first contact member and has a length sufficient to (1) enter a second aperture of a second contact member conductively mounted on a second circuit board parallel to and adjacent one side of the first circuit board and (2) contact a power connector adjacent an opposite side of the first circuit board to thereby allow the rod to distribute electrical current to multiple circuit boards.

Although the present invention and its advantages have been described in detail, it should be understood that various changes, substitutions and alterations can be made herein without departing from the spirit and scope of the invention as defined by the appended claims.

What is claimed is:

1. A power distribution system for supplying power to a first circuit board, said first circuit board having a first contact member conductively mounted thereto, a first aperture through said first contact member substantially coaxially aligned with a first opening through said first circuit board, said system comprising:

an elongated conductive rod removably positioned through said first aperture and said first opening and extending normally from said first circuit board, said rod being electrically connectable to said first circuit board by said first contact member and having a length sufficient to (a) enter a second aperture of a second contact member conductively mounted on a second circuit board parallel to and adjacent one side of said first circuit board and (b) contact a power connector adjacent an opposite side of said first circuit board to thereby allow said rod to distribute electrical current to multiple circuit boards.

2. The system as recited in claim 1 further comprising a second circuit board having a second contact member conductively mounted thereto, a second aperture through said second contact member substantially coaxially aligned with a second opening through said second circuit board, said rod removably positioned through said second aperture and said second opening thereby electrically coupling said second circuit board to said rod.

3. The system as recited in claim 1 wherein said first contact member comprises a resilient conductive member adapted to urge against said rod to make electrical contact therewith.

4. The system as recited in claim 1 further comprising a chassis housing said first and second circuit boards.

5. The system as recited in claim 1 further comprising a chassis member having a chassis member aperture and interposed between said first and second circuit boards, said first, second and chassis member apertures substantiality co-linear with respect to one another to allow said rod to pass through said first, second and chassis member apertures.

6. The system as recited in claim 1 further comprising an electromagnetic shield interposed between said first and second circuit boards.

7. The system as recited in claim 1 further comprising a chassis member formed of conductive material, having a chassis member aperture and interposed between said first and second circuit boards to form an electromagnetic shield, said first, second and chassis member apertures substantially co-linear with respect to one another to allow said rod to pass through said first, second and chassis member apertures, an insulator electrically disposed in said chassis member aperture to isolate said rod from said chassis member.

8. The system as recited in claim 1 wherein said first contact member comprises a mounting pin for mechanically and electrically mounting said first contact member to said first circuit board.

9. The system as recited in claim 1 wherein said first contact member has an insulating cap thereabout electrically to insulate said first contact member.

10. The system as recited in claim 1 wherein said power connector comprises an electrical contact located within a socket body and a flexible conductor coupled to said electrical contact, said electrical contact adapted to receive an end of said rod to allow electrical transmission between said flexible conductor and said rod, said power connector mechanically coupled to a selected one of said rod and an insulating cap located about said first contact by a force selected from the group consisting of:

frictional force and positive engagement.

11. A method of distributing power to a first circuit board, said first circuit board having a first contact member conductively mounted thereto, a first aperture through said first contact member substantially coaxially aligned with a first opening through said first circuit board, said method comprising the steps of:

removably positioning an elongated conductive rod through said first aperture and said first opening and extending normally from said first circuit board, said rod being electrically connectable to said first circuit board by said first contact member and having a length sufficient to (a) enter a second aperture of a second contact member conductively mounted on a second circuit board parallel to and adjacent one side of said first circuit board and (b) contact a power connector adjacent an opposite side of said first circuit board; and distributing electrical current to said first circuit board via said rod.

12. The method as recited in claim 11 further comprising the step of coupling said rod to a second circuit board having a second contact member conductively mounted thereto, a second aperture through said second contact member substantially coaxially aligned with a second opening through said second circuit board, said rod removably positioned through said second aperture and said second opening thereby electrically coupling said second circuit board to said rod.

13. The method as recited in claim 11 wherein said step of coupling comprises the step of urging a resilient conductive member in said first contact member against said rod to make electrical contact therewith.

14. The method as recited in claim 11 further comprising the step of housing said first and second circuit boards in a chassis.

15. The method as recited in claim 11 further comprising the step of interposing a chassis member having a chassis member aperture between said first and second circuit boards, said first, second and chassis member apertures substantially co-linear with respect to one another to allow said rod to pass through said first, second and chassis member apertures.

16. The method as recited in claim 11 further comprising the step of interposing an electromagnetic shield between said first and second circuit boards.

17. The method as recited in claim 11 further comprising the step of interposing a chassis member formed of conductive material and having a chassis member aperture between said first and second circuit boards to form an electromagnetic shield, said first, second and chassis member apertures substantially co-linear with respect to one another to allow said rod to pass through said first, second and chassis member apertures, an insulator electrically disposed in said chassis member aperture to isolate said rod from said chassis member.

18. The method as recited in claim 11 further comprising the step of mechanically and electrically mounting said first contact member to said first circuit board with a mounting pin in said first contact member.

19. The method as recited in claim 11 further comprising the step of electrically insulating said first contact member with an insulating cap about said first contact member.

20. The method as recited in claim 11 further comprising the step of coupling said power connector to said rod, said power connector comprising an electrical contact located within a socket body and a flexible conductor coupled to said electrical contact, said electrical contact adapted to receive an end of said rod to allow electrical transmission between said flexible conductor and said rod, said power connector mechanically coupled to a selected one of said rod and an insulating cap located about said first contact by a force selected from the group consisting of:

frictional force and positive engagement.

21. A power distribution system for supplying power to a first circuit board, said first circuit board having a first contact member conductively mounted thereto, said first contact member having a mounting pin for mechanically and electrically mounting said first contact member to said first circuit board, a first aperture through said first contact member substantially coaxially aligned with a first opening through said first circuit board and a second circuit board substantially parallel to said first circuit board and having a second contact member conductively mounted thereto, said second contact member having a mounting pin for mechanically and electrically mounting said second contact member to said second circuit board, a second aperture through said second contact member substantially coaxially aligned with a second opening through said second circuit board said first and second apertures substantially coaxially aligned, said system comprising:

- an elongated conductive rod removably positioned through said first aperture and said first opening and extending normally from said first circuit board, said rod passing through a chassis member aperture in a chassis member interposed between said first and second circuit boards, said first, second and chassis member apertures substantially co-linear with respect to one another, said rod further removably positioned through said chassis member aperture, said second aperture and said second opening; and
- a power connector having an electrical contact located within a socket body and a flexible conductor coupled to said electrical contact, said electrical contact adapted to receive an end of said rod to allow electrical transmission between said flexible conductor and said rod to thereby allow said rod electrically to couple said power connector and said first and second circuit boards.

22. The system as recited in claim 21 wherein said first and second contact members comprise resilient conductive members adapted to urge against said rod to make electrical contact therewith.

23. The system as recited in claim 21 further comprising a chassis housing said first and second circuit boards.

24. The system as recited in claim 21 wherein said chassis member forms an electromagnetic shield between said first and second circuit boards.

25. The system as recited in claim 21 wherein said chassis member is formed of conductive material and further includes an insulator electrically disposed in said chassis member aperture to isolate said rod from said chassis member.

26. The system as recited in claim 21 wherein said first and second contact members have insulating caps thereabout electrically to insulate said first and second contact members.

27. The system as recited in claim 21 wherein said power connector is mechanically coupled to a selected one of said rod and said insulating cap located about said first contact member by a force selected from the group consisting of:

frictional force and positive engagement.

28. The system as recited in claim 21 wherein an end of said rod is disposed within said second aperture.

29. The system as recited in claim 21 wherein said power connector is mechanically coupled to said rod by a frictional force excreted by said electrical contact against said rod member.

30. The system as recited in claim 21 wherein said power connector is mechanically coupled to said first contact member by positive engagement through detents formed on said power connector and said first contact member connectively cooperating with each other.

31. The system as recited in claim 21 wherein a front side of said first circuit board has integrated circuits and printed circuits thereon electrically connected to said first contact member.

32. The system as recited in claim 21 wherein a front side of said second circuit board has interconnected integrated circuits and printed circuits thereon which are electrically connected to said second contact member.

33. The system as recited in claim 21 wherein said first and second circuit boards are housed in a rack cabinet, said rack cabinet having a plurality of drawers for housing therein a plurality of additional circuit boards having interconnected integrated circuits and printed circuits thereon.

34. The system as recited in claim 21 wherein said first and second circuit boards are interconnected with and form a part of a computer system.

35. The system as recited in claim 21 wherein said chassis member serves as a support structure for said rod.

\* \* \* \* \*